(12) United States Patent
Ma et al.

(10) Patent No.: US 11,488,411 B2
(45) Date of Patent: Nov. 1, 2022

(54) PANEL FOR FINGERPRINT IDENTIFICATION, AND CONTROL METHOD THEREOF, AND APPARATUS FOR FINGERPRINT IDENTIFICATION

(71) Applicant: BOE Technology Group Co., Ltd., Beijing (CN)

(72) Inventors: Yuanyuan Ma, Beijing (CN); Yapeng Li, Beijing (CN); Xiaoliang Ding, Beijing (CN); Haisheng Wang, Beijing (CN); Jiabin Wang, Beijing (CN); Xueyou Cao, Beijing (CN); Pengpeng Wang, Beijing (CN); Wenjuan Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 169 days.

(21) Appl. No.: 16/892,233

(22) Filed: Jun. 3, 2020

(65) Prior Publication Data
US 2021/0192170 A1 Jun. 24, 2021

(30) Foreign Application Priority Data
Dec. 19, 2019 (CN) .......................... 201911317959.7

(51) Int. Cl.
| | |
|---|---|
| *G06K 9/20* | (2006.01) |
| *G06V 40/13* | (2022.01) |
| *H01L 25/16* | (2006.01) |
| *H01L 25/18* | (2006.01) |
| *G06V 40/12* | (2022.01) |
| *G02F 1/157* | (2006.01) |

(Continued)

(52) U.S. Cl.
CPC ...... *G06V 40/1318* (2022.01); *G06V 40/1365* (2022.01); *H01L 25/167* (2013.01); *H01L 25/18* (2013.01); *G02F 1/133526* (2013.01); *G02F 1/133603* (2013.01); *G02F 1/157* (2013.01)

(58) Field of Classification Search
CPC ............ G06V 40/1318; G06V 40/1365; H01L 25/167; H01L 25/18; G02F 1/133526; G02F 1/133603; G02F 1/157; G06K 9/2036
See application file for complete search history.

(56) References Cited

U.S. PATENT DOCUMENTS

2017/0372113 A1* 12/2017 Zhang .................. G06K 9/2036

\* cited by examiner

*Primary Examiner* — Abdul-Samad A Adediran
(74) *Attorney, Agent, or Firm* — Ling Wu; Stephen Yang; Ling and Yang Intellectual Property

(57) ABSTRACT

A panel for fingerprint identification and a control method thereof, and an apparatus for fingerprint identification. The panel for fingerprint identification includes: a display unit, a control unit, a unit for adjusting light transmittance and a unit for fingerprint identification which are disposed on a backlight side of the display unit, wherein an operating state of the panel for fingerprint identification includes: a display stage and a fingerprint identification stage. At the display stage, the display unit is configured to emit first light to display an image to be displayed, the unit for adjusting light transmittance is configured to transmit light transmitted through the display unit, and the control unit is connected with the unit for adjusting light transmittance and is configured to control the light transmittance of the unit for adjusting light transmittance.

17 Claims, 6 Drawing Sheets

(51) Int. Cl.
*G02F 1/1335* (2006.01)
*G02F 1/13357* (2006.01)

PANEL FOR FINGERPRINT IDENTIFICATION, AND CONTROL METHOD THEREOF, AND APPARATUS FOR FINGERPRINT IDENTIFICATION

CROSS-REFERENCE TO RELATED APPLICATION

The present application claims the priority to the Chinese patent application No. 201911317959.7, filed to the CNIPA on Dec. 19, 2019, the content of which is hereby incorporated by reference.

TECHNICAL FIELD

The present disclosure relates to, but is not limited to, the technical field of fingerprint identification, in particular to a panel for fingerprint identification, and a control method thereof, and an apparatus for fingerprint identification.

BACKGROUND

Fingerprint identification refers to that identification of persons is performed by comparing detailed feature points of different fingerprints. Because everyone's fingerprints are different, identification of persons may be performed by fingerprints. Thanks to the breaking of a production capacity barrier of an organic light-emitting diode (OLED), technological maturity and foreseeable cost reduction, an optical fingerprint identification technology has become one of important means for realizing of fingerprint identification.

In the optical fingerprint identification technology, an optical fingerprint identification device is usually arranged on a side of a whole OLED display substrate. Light emitted from the OLED display substrate is reflected by a fingerprint and then transmitted through the whole OLED display substrate to reach the optical fingerprint identification device, and the optical fingerprint identification device forms a fingerprint image according to received light to identify the fingerprint.

SUMMARY

The following is a summary of subject matter described in detail in the present disclosure. This summary is not intended to limit the scope of protection of the claims.

In a first aspect, the present disclosure provides a panel for fingerprint identification, including: a display unit, a control unit, and a unit for adjusting light transmittance and a unit for fingerprint identification which are disposed on a backlight side of the display unit, wherein the unit for adjusting light transmittance is disposed on a side of the unit for fingerprint identification close to the display unit, and an operating state of the panel for fingerprint identification includes a display stage and a fingerprint identification stage.

At the display stage, the display unit is configured to emit first light to display an image to be displayed, the unit for adjusting light transmittance is configured to transmit light transmitted through the display unit, and the control unit is connected with the unit for adjusting light transmittance and is configured to control light transmittance of the unit for adjusting light transmittance so that the light transmittance of the unit for adjusting light transmittance is less than or equal to a threshold of light transmittance.

In some possible implementations, at the fingerprint identification stage.

The display unit is configured to emit second light to a fingerprint to be detected.

The unit for adjusting light transmittance is configured to transmit the second light reflected by the fingerprint to be detected.

The control unit is configured to control the light transmittance of the unit for adjusting light transmittance so that the light transmittance of the unit for adjusting light transmittance is greater than the threshold of light transmittance.

The unit for fingerprint identification is configured to receive light transmitted through the unit for adjusting light transmittance and obtain a fingerprint image according to the light transmitted through the unit for adjusting light transmittance to identify a fingerprint.

In some possible implementations, the control unit is configured to generate a first control signal at the display stage, and control the light transmittance of the unit for adjusting light transmittance according to the first control signal, so that the light transmittance of the unit for adjusting light transmittance is less than or equal to the threshold of light transmittance.

In some possible implementations, the control unit is configured to generate a second control signal at the fingerprint identification stage, and control the light transmittance of the unit for adjusting light transmittance according to the second control signal, so that the light transmittance of the unit for adjusting light transmittance is greater than the threshold of light transmittance.

In some possible implementations, the unit for fingerprint identification includes: a substrate and multiple photoelectric sensors disposed on the substrate.

The multiple photoelectric sensors are disposed on a side of the substrate close to the display unit.

In some possible implementations, the display unit includes: multiple point light sources, and the multiple point light sources sequentially emit light at a fingerprint identification stage.

In some possible implementations, the unit for adjusting light transmittance includes: multiple structures for adjusting light transmittance, wherein the multiple structures for adjusting light transmittance correspond to multiple point light sources one by one.

An orthographic projection of the structures for adjusting light transmittance on the display unit covers an orthographic projection of the point light sources corresponding to the structures for adjusting light transmittance on the display unit.

The control unit is connected with each structure for adjusting light transmittance, and is configured to control light transmittance of each structure for adjusting light transmittance.

In some possible implementations, each structure for adjusting light transmittance includes: a first electrode and a second electrode, and a layer for adjusting light transmittance disposed between the first electrode and the second electrode.

The control unit is connected with the first electrode and the second electrode. The control unit is configured to, at the display stage, provide electric signals to the first electrode and the second electrode according to a first control signal, and form a first electric field between the first electrode and the second electrode so that light transmittance of the layer for adjusting light transmittance is less than or equal to the threshold of light transmittance under a role of the first electric field. The control unit is further configured to, at the fingerprint identification stage, provide electrical signals to the first electrode and the second electrode according to a second control signal, and form a second electric field between the first electrode and the second electrode so that the light transmittance of the layer for adjusting light transmittance is greater than the threshold of light transmittance under a role of the second electric field.

In some possible implementations, the first electrode and the second electrode are transmissive electrodes.

In some possible implementations, first electrodes of adjacent structures for adjusting light transmittance are spaced apart, and second electrodes of adjacent structures for adjusting light transmittance are spaced apart.

In some possible implementations, an i-th point light source corresponds to an i-th structure for adjusting light transmittance.

Under a state that the i-th point light source emits light, the control unit is configured to, at the fingerprint identification stage, control light transmittance of the i-th structure for adjusting light transmittance to be first light transmittance according to the second control signal, and control light transmittance of all other structures for adjusting light transmittance except the i-th structure for adjusting light transmittance to be second light transmittance, wherein the first light transmittance is less than or greater than the second light transmittance, $1 \leq i \leq N$, and the N is a quantity of point light sources.

In some possible implementations, first electrodes of adjacent structures for adjusting light transmittance are connected to each other, and second electrodes of adjacent structures for adjusting light transmittance are connected to each other.

In some possible implementations, the layer for adjusting light transmittance is a liquid crystal layer.

The liquid crystal layer includes: a holographic polymer dispersed liquid crystal Bragg grating or a cholesteric liquid crystal.

In some possible implementations, the layer for adjusting light transmittance is a color change layer.

A preparation material of the color change layer includes: polyaniline, viologen, tungsten trioxide, polythiophenes and derivatives thereof, viologen compounds, tetrathiafulvalene or metal phthalocyanine compounds.

In some possible implementations, the panel for fingerprint identification further includes: a collimating layer.

The collimating layer is disposed on a side of the unit for adjusting light transmittance close to the display unit and is configured to filter incident light, so that light with a scattering angle within a threshold range is emitted toward the unit for adjusting light transmittance.

The incident light is the light transmitted through the display unit at the display stage, and the second light reflected by the fingerprint to be detected at the fingerprint identification stage.

In some possible implementations, the unit for fingerprint identification is disposed on a side of the unit for adjusting light transmittance remote from the display unit by an optical adhesive.

In some possible implementations, the display unit includes: an organic light emitting diode display substrate.

In a second aspect, the present disclosure also provides an apparatus for fingerprint identification, including the above panel for fingerprint identification.

In a third aspect, the present disclosure also provides a control method of a panel for fingerprint identification, which is applied to the above panel for fingerprint identification, and the method includes: at the display stage, emitting the first light to display the image to be displayed, controlling the light transmittance of the unit for adjusting light transmittance so that the light transmittance of the unit for adjusting light transmittance is less than or equal to the threshold of light transmittance, and transmitting the light transmitted through the display unit.

In some possible implementations, the method further includes: at a fingerprint identification stage, emitting second light to a fingerprint to be detected, controlling the light transmittance of the unit for adjusting light transmittance so that the light transmittance of the unit for adjusting light transmittance is greater than the threshold of light transmittance, transmitting the second light reflected by the fingerprint to be detected, and receiving the light transmitted through the unit for adjusting light transmittance, and obtaining a fingerprint image according to the light transmitted through the unit for adjusting light transmittance to identify a fingerprint.

Other aspects will become apparent upon reading and understanding accompanying drawings and the detailed description.

BRIEF DESCRIPTION OF DRAWINGS

Accompanying drawings are used to provide a further understanding of technical solutions of the present disclosure and form a part of the specification. Together with embodiments of the present disclosure, they are used to explain technical solutions of the present disclosure and do not constitute a limitation on the technical solutions of the present disclosure.

DETAILED DESCRIPTION

Figure 1:
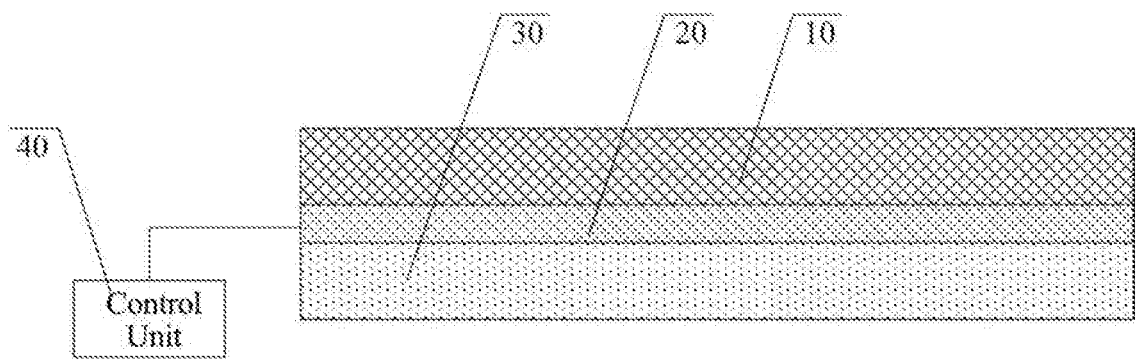
FIG. 1 is a schematic structural diagram of a panel for fingerprint identification provided by an embodiment of the present disclosure.

Hereinafter, embodiments of the present disclosure will be described in detail with reference to the accompanying drawings. Without conflict, embodiments in the present disclosure and features in the embodiments may be combined with each other arbitrarily.

The present disclosure describes multiple embodiments, but the description is exemplary rather than limiting, and for those of ordinary skill in the art, there may be more embodiments and implementation solutions within the scope of the embodiments described in the present disclosure. Although many possible combinations of features are shown in the drawings, and have been discussed in specific embodiments, many other combinations of the disclosed features are also possible. Unless specifically limited, any feature or element of any embodiment may be used in combination with or in place of any other feature or element of any other embodiment.

The present disclosure includes and contemplates combinations of features and elements known to those of ordinary skill in the art. Embodiments, features and elements already disclosed in the present disclosure may also be combined with any conventional feature or element to form a technical solution defined by the claims. Any feature or element of any embodiment may also be combined with features or elements from another technical solution to form another technical solution defined by the claims. Therefore, it should be understood that any of the features shown and discussed in the present disclosure may be implemented individually or in any suitable combination. Therefore, the embodiments are not limited except by the limitations according to the appended claims and their equivalents. In addition, various modifications and changes may be made within the scope of protection of the appended claims.

Unless otherwise defined, technical terms or scientific terms used in the present disclosure shall have the ordinary meaning understood by those with ordinary skills in the field to which the present disclosure belongs. The words "first", "second" and the like used in the present disclosure do not represent any order, quantity or importance, but are only used to distinguish different component parts. The word "including", "containing", or the like means that an element or an article appearing before the word covers elements or articles listed after the word and their equivalents and does not exclude other elements or articles. The word "connected", "connected with", or the like is not limited to physical or mechanical connections, but may include electrical connections, either directly or indirectly. "Up", "Down", "Left", "Right" and so on only represent a relative positional relationship. After an absolute position of a described object changes, the relative positional relationship may also change accordingly.

A PIN photodiode is used by an optical fingerprint identification device. Before fingerprint identification, the PIN photodiode absorbs ambient light transmitted through an OLED display substrate or light emitted by an OLED display substrate. Due to a performance defect of the PIN photodiode material, it is caused that charges converted by the PIN photodiode cannot be quickly transferred totally. As a result, a part of the charges will be residual in the PIN photodiode in a fingerprint identification process, the lag phenomenon of a bright spot arises, accuracy of a fingerprint image is led to not high, and fingerprint identification precision is reduced.

Figure 2:
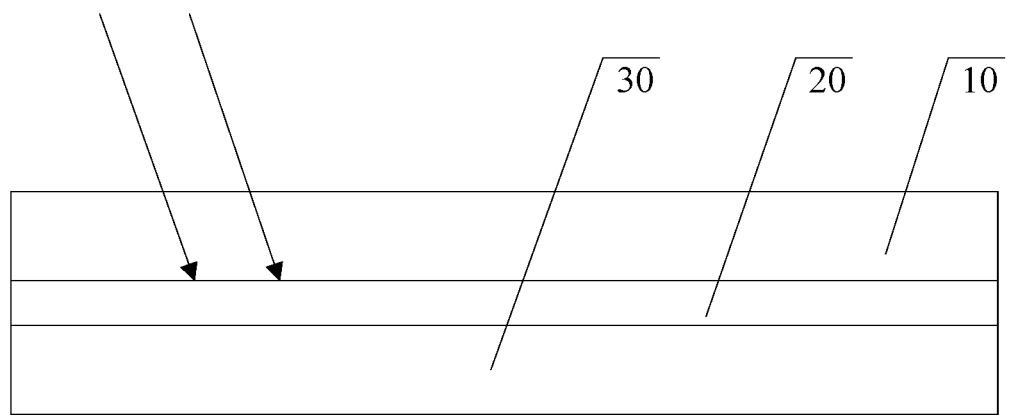
FIG. 2 is an optical path diagram of a panel for fingerprint identification at a display stage provided by an embodiment of the present disclosure.

FIG. 1 is a schematic structural diagram of a panel for fingerprint identification provided by an embodiment of the present disclosure, and FIG. 2 is an optical path diagram of a panel for fingerprint identification at a display stage provided by an embodiment of the present disclosure. As shown in FIGS. 1 and 2, a panel for fingerprint identification provided by an embodiment of the present disclosure includes: a display unit 10, a unit for adjusting light transmittance 20, a unit for fingerprint identification 30, and a control unit 40. The unit for adjusting light transmittance 20 and the unit for fingerprint identification 30 are disposed on a backlight side of the display unit 10, and the unit for adjusting light transmittance 20 is disposed on a side of the unit for fingerprint identification 30 close to the display unit 10.

An operating state of the panel for fingerprint identification includes: a display stage and a fingerprint identification stage. At the display stage, the display unit 10 is configured to emit first light to display an image to be displayed, the unit for adjusting light transmittance 20 is configured to transmit light transmitted through the display unit 10, the control unit 40 is connected with the unit for adjusting light transmittance 20 and is configured to control light transmittance of the unit for adjusting light transmittance 20, so that the light transmittance of the unit for adjusting light transmittance 20 is less than or equal to a threshold of light transmittance.

The panel for fingerprint identification may perform a display function but cannot perform a fingerprint identification function at the display stage, and may perform a fingerprint identification function but cannot perform a display function at the fingerprint identification stage.

In an exemplary embodiment, when a fingerprint to be detected touches an identification region in the panel for fingerprint identification, the panel for fingerprint identification generates a touch trigger signal, and enters the fingerprint identification stage after a display stage.

In an exemplary embodiment, at the display stage, the light transmitted through the display unit 10 may be ambient light.

In an exemplary embodiment, a numerical value of the threshold of light transmittance may be determined according to a fingerprint identification precision.

In an exemplary embodiment, the control unit 40 may be implemented by a processor which executes logical calculation, such as a central processing unit/processor (CPU), a field-programmable gate array (FPGA), a digital signal processor (DSP), a microcontroller unit (MCU) or an application specific integrated circuit (ASIC). The processor may include a memory communicatively connected to the processor. Any combination of one or more computer program products is stored on the memory, the memory may include various forms of computer readable storage media, such as a volatile memory or a non-volatile memory. The volatile memory may include, for example, a random access memory (RAM) or a cache memory. The non-volatile memory may include, for example, a read only memory (ROM), a hard disk, an erasable programmable read only memory (EPROM), a universal serial bus (USB), or a flash memory. One or more computer instructions may be stored in the memory, and the processor may execute the computer instructions to implement an analysis function of an analysis module. Various application programs and various data such as various data used and generated by the application program may also be stored in the computer readable storage medium.

In an exemplary embodiment, connections between the control unit 40 and the unit for adjusting light transmittance 20 are all communication connections. Herein, the communication connections include connection performed through a wireless network, a wired network or any combination of the wireless network and the wired network. The network may include a local area network, the Internet, a telecommunication network, an Internet of Things based on the Internet or the telecommunication network, or any combination of the above networks. The wired network may use, for example, a transmission mode of a wire, a twisted pair, a coaxial cable or an optical fiber for information transmission. The wireless network may use, for example, a mode of a WWAN mobile communication network, Bluetooth, Zigbee or WiFi for information transmission.

At the display stage, the light transmittance of the unit for adjusting light transmittance 20 being less than or equal to the threshold of light transmittance, may cause that light cannot enter the unit for fingerprint identification at the display stage, and ensure that no residual charge exists in the unit for fingerprint identification at the fingerprint identification stage.

A panel for fingerprint identification provided by an embodiment of the present disclosure includes: a display unit, a control unit, a unit for adjusting light transmittance and a unit for fingerprint identification which are disposed on a backlight side of the display unit, wherein the unit for adjusting light transmittance is disposed on a side of the unit for fingerprint identification close to the display unit, and an operating state of the panel for fingerprint identification includes: a display stage and a fingerprint identification stage. At the display stage, the display unit is configured to emit first light to display an image to be displayed, the unit for adjusting light transmittance is configured to transmit light transmitted through the display unit, and the control unit is connected with the unit for adjusting light transmittance and is configured to control light transmittance of the unit for adjusting light transmittance so that the light transmittance of the unit for adjusting light transmittance is less than or equal to a threshold of light transmittance. According to the present disclosure, the light transmittance of the unit for adjusting light transmittance is controlled by the control unit. As a result, the light transmitted through the display unit cannot enter the unit for fingerprint identification before the fingerprint identification stage, the residual of part of electric charges in the unit for fingerprint identification may be avoided in the fingerprint identification process, accuracy of the formed fingerprint image and fingerprint identification precision are improved.

Figure 3:
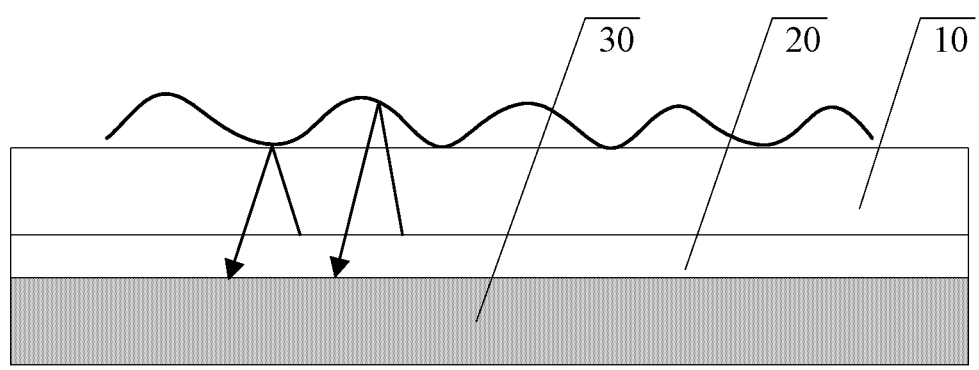
FIG. 3 is an optical path diagram of a panel for fingerprint identification at a fingerprint identification stage provided by an exemplary embodiment.

FIG. 3 is an optical path diagram of a panel for fingerprint identification at a fingerprint identification stage provided by an exemplary embodiment. As shown in FIGS. 1 and 3, at the fingerprint identification stage, the display unit 10 is configured to emit second light to a fingerprint to be detected. The unit for adjusting light transmittance 20 is configured to transmit the second light reflected by the fingerprint to be detected. The control unit 30 is configured to control the light transmittance of the unit for adjusting light transmittance 20 so that the light transmittance of the unit for adjusting light transmittance 20 is greater than a threshold of light transmittance. The unit for fingerprint identification 30 is configured to receive light transmitted through the unit for adjusting light transmittance 20, and obtain a fingerprint image according to the light transmitted through the unit for adjusting light transmittance 20 to identify a fingerprint.

Figure 4:
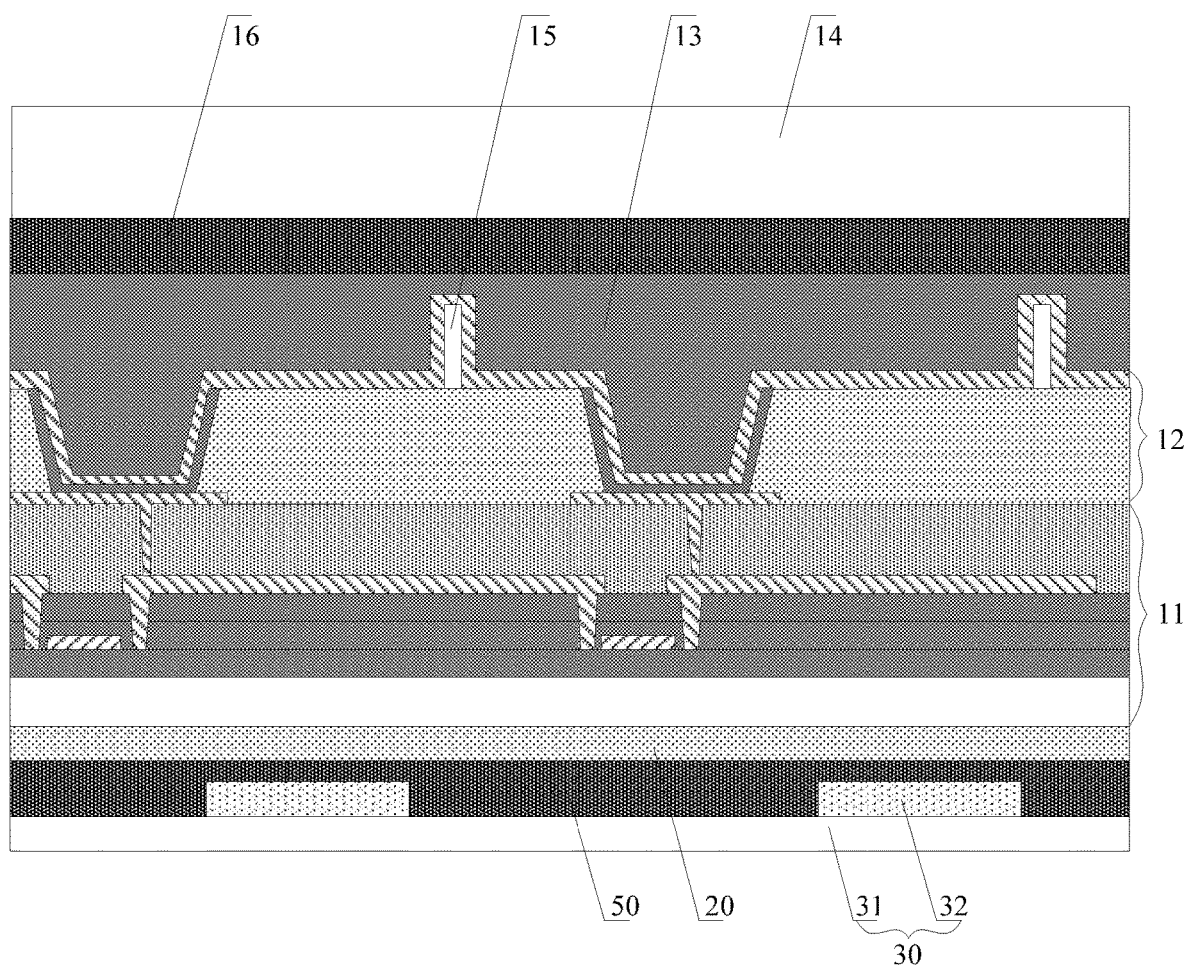
FIG. 4 is a schematic structural diagram of a panel for fingerprint identification provided by an exemplary embodiment.

FIG. 4 is a schematic structural diagram of a panel for fingerprint identification provided by an exemplary embodiment. As shown in FIG. 4, the display unit 10 in an exemplary embodiment may be an OLED display substrate. Herein, the OLED display substrate includes: a driving back plate 11, a light emitting element 12 disposed on the driving back plate 11, a packaging layer 13 disposed on a side of the light emitting element 12 remote from the driving back plate 11, and a cover plate 14 disposed on a side of the packaging layer 13 remote from the driving back plate 11.

In an exemplary embodiment, the OLED display substrate includes: a display region and a non-display region. The non-display region surrounds the display region. Fingerprint identification may be implemented in the display region of the OLED display substrate.

In an exemplary embodiment, the drive backplane 11 may include: a substrate, a thin film transistor disposed on the substrate, and a flat layer disposed on a side of the thin film transistor remote from the substrate.

In an exemplary embodiment, the substrate may be a rigid substrate or a flexible substrate, wherein the rigid substrate may be, but is not limited to, one or more of glass and metal foil; the flexible substrate may be, but is not limited to, one or more of polyethylene terephthalate, ethylene terephthalate, polyether ether ketone, polystyrene, polycarbonate, polyarylate, polyimide, polyvinyl chloride, polyethylene, and textile fibers.

In an exemplary embodiment, the thin film transistor may include: a gate electrode, an active layer, and a source and drain electrode. The thin film transistor may be in a top gate structure or may be in a bottom gate structure. Illustraion is given in FIG. 4 by taking a thin film thin film transistor in a top gate structure as an example.

In an exemplary embodiment, the light emitting element 12 may include: a pixel defining layer, an anode, an organic light emitting layer, and a cathode, wherein the anode is connected with a drain electrode of a thin film transistor.

In an exemplary embodiment, the packaging layer 13 is configured to prevent moisture and oxygen from entering the organic light emitting layer, which may prolong a life of the panel for fingerprint identification.

In an exemplary embodiment, the packaging layer 13 may be of a multi-layer structure. The multi-layer structure includes: a first packaging layer, a second packaging layer and a third packaging layer which are sequentially disposed along a direction perpendicular to the substrate.

In an exemplary embodiment, the first packaging layer and the third packaging layer cover the display region and the non-display region.

In an exemplary embodiment, a preparation material of the first packaging layer and the third packaging layer may be an inorganic material, such as silicon oxide, silicon nitride, or a composite of silicon oxide and silicon nitride.

In an exemplary embodiment, the second packaging layer covers the display region, and an orthographic projection of the second packaging layer on the substrate does not overlap with the non-display region.

In an exemplary embodiment, a preparation material of the second packaging layer may be an organic material, such as parylene.

In an exemplary embodiment, the cover plate 14 may be a glass cover plate, or may be another transparent cover plate.

In an exemplary embodiment, the display unit may further include another structure, such as a spacer 15 disposed between the pixel defining layer and the cathode, an optical adhesive 16 disposed between the packaging layer 13 and the cover plate 14.

In an exemplary embodiment, as shown in FIG. 4, the unit for fingerprint identification 30 includes: a substrate 31 and multiple photoelectric sensors 32 disposed on the substrate 31. Multiple photoelectric sensors 32 are disposed on a side of the substrate 31 close to the display unit 10.

In an exemplary embodiment, an arrangement mode of the multiple photoelectric sensors 32 may be a matrix arrangement.

In an exemplary embodiment, the substrate 31 may be a rigid substrate or a flexible substrate, wherein the rigid substrate may be, but is not limited to, one or more of glass and metal foil; the flexible substrate may be, but is not limited to, one or more of polyethylene terephthalate, ethylene terephthalate, polyether ether ketone, polystyrene, polycarbonate, polyarylate, polyarylate, polyimide, polyvinyl chloride, polyethylene, and textile fibers.

In an exemplary embodiment, the photosensor 32 is a PIN photosensor. In an exemplary embodiment, as shown in FIG. 4, the unit 30 for fingerprint identification is disposed on a side of the unit for adjusting light transmittance 20 remote from the display unit 10 through an optical adhesive 50.

In an exemplary embodiment, the control unit 40 is configured to generate a first control signal at a display stage, and control light transmittance of the unit for adjusting light transmittance according to the first control signal, so that the light transmittance of the unit for adjusting light transmittance is less than or equal to the threshold of light transmittance.

In an exemplary embodiment, the control unit 40 is configured to generate a second control signal at a fingerprint identification stage, and control light transmittance of the unit for adjusting light transmittance according to the second control signal, so that the light transmittance of the unit for adjusting light transmittance is greater than the threshold of light transmittance.

Figure 5:
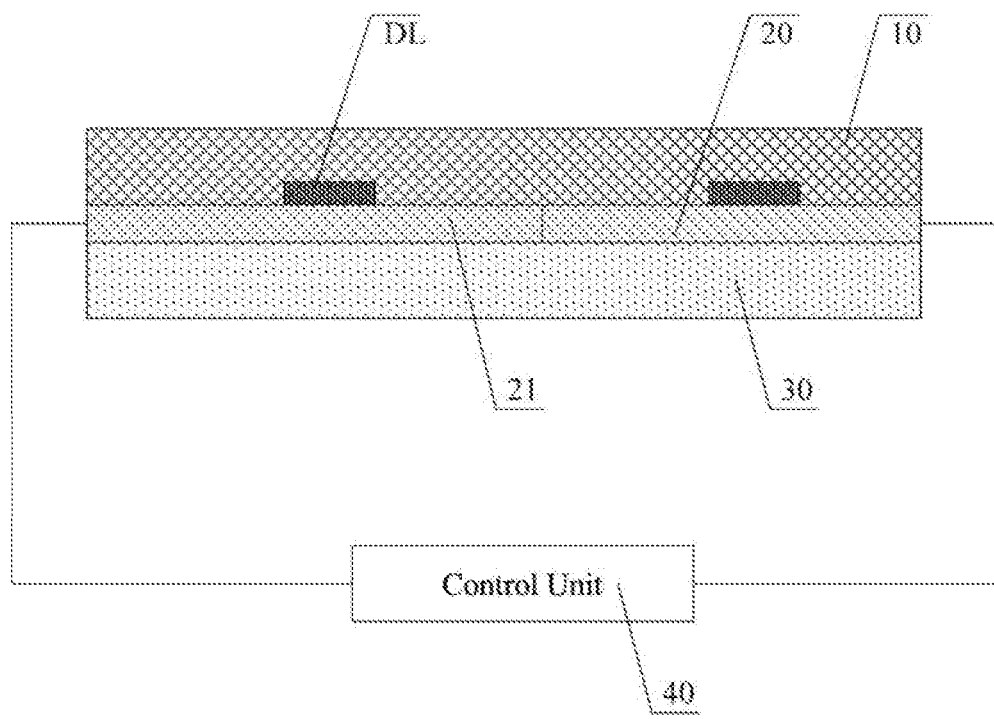
FIG. 5 is a schematic structural diagram of a panel for fingerprint identification provided by another exemplary embodiment.

FIG. 5 is a schematic structural diagram of a panel for fingerprint identification provided by another exemplary embodiment. As shown in FIG. 5, the display unit 10 includes: multiple point light sources DL. The multiple point light sources DL sequentially emit light at the fingerprint identification stage.

In an exemplary embodiment, a quantity of point light sources is determined according to a fingerprint identification precision. Illustration is given in FIG. 5 by taking two point light sources as an example.

In an exemplary embodiment, each point light source is composed of at least one sub-pixel.

In an exemplary embodiment, as shown in FIG. 5, the unit for adjusting light transmittance 20 includes: multiple structures for adjusting light transmittance 21, wherein the multiple structures for adjusting light transmittance 21 correspond to the multiple point light sources DL one by one. An orthographic projection of the structures for adjusting light transmittance 21 on the display unit 10 covers an orthographic projection of the point light sources DL corresponding to the structures for adjusting light transmittance 21 on the display unit 10.

The control unit 40 is connected with each structure for adjusting light transmittance 21, and is configured to control light transmittance of each structure for adjusting light transmittance.

Figure 6:
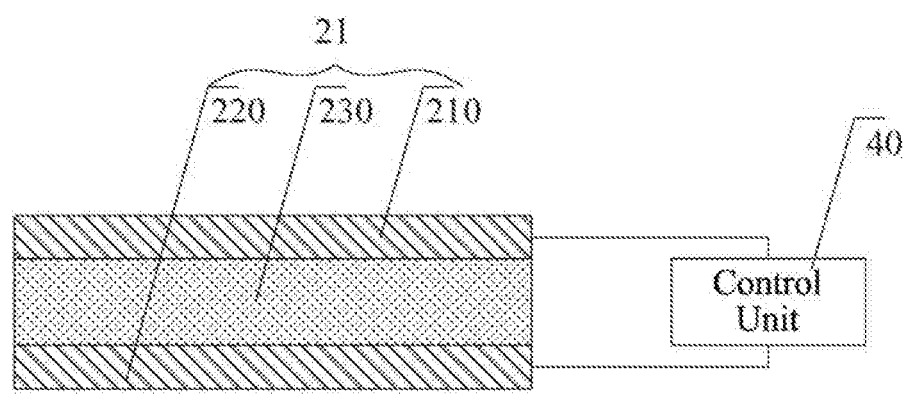
FIG. 6 is a schematic structural diagram of a structure for adjusting light transmittance provided by an exemplary embodiment.

FIG. 6 is a schematic structural diagram of a structure for adjusting light transmittance provided by an exemplary embodiment. As shown in FIG. 6, each structure for adjusting light transmittance 21 includes: a first electrode 210 and a second electrode 220, and a layer for adjusting light transmittance 230 disposed between the first electrode 210 and the second electrode 220.

The control unit 40 is connected with the first electrode 210 and the second electrode 220. The control unit 40 is configured to, at the display stage, provide electric signals to the first electrode 210 and the second electrode 220 according to a first control signal, and form a first electric field between the first electrode and the second electrode so that the light transmittance of the layer for adjusting light transmittance is less than or equal to the threshold of light transmittance under a role of the first electric field. The control unit 40 is further configured to, at the fingerprint identification stage, provide electrical signals to the first electrode 210 and the second electrode 220 according to a second control signal, and form a second electric field between the first electrode 210 and the second electrode 220 so that light transmittance of the layer for adjusting light transmittance is greater than the threshold of light transmittance under a role of the second electric field.

In an exemplary embodiment, the first electrode 210 and the second electrode 220 are transmissive electrodes. A preparation material of the first electrode 210 and the second electrode 220 may be a transparent conductive material. The transparent conductive material may be indium tin oxide or zinc tin oxide.

In an exemplary embodiment, the layer for adjusting light transmittance 230 may be a liquid crystal layer. The liquid crystal layer includes: a holographic polymer dispersed liquid crystal Bragg grating or a cholesteric liquid crystal.

A liquid crystal molecule in the liquid crystal layer in the layer for adjusting light transmittance 230 is configured to deflect under a role of an electric field between the first electrode 210 and the second electrode 220. Deflection angles of the liquid crystal molecule corresponding to different electric fields are different, and light transmittance of the layer for adjusting light transmittance is also different.

At the display stage, the liquid crystal layer maintains low light transmittance under a role of the first electric field. At the fingerprint identification stage, the liquid crystal layer maintains high light transmittance under a role of the second electric field, which may ensure that light reflected by a fingerprint to be detected enters a unit for fingerprint identification.

In an exemplary embodiment, the layer for adjusting light transmittance 230 may be a color change layer. A preparation material of the color change layer is an electrochromic material. Herein, electrochromism is a phenomenon in which optical properties (reflectivity, light transmittance, absorptivity, etc.) of a material undergo stable and reversible color changes under a role of an applied electric field, which is manifested as reversible changes in color and transparency in appearance. A material with an electrochromic performance is called an electrochromic material.

In an exemplary embodiment, the electrochromic material includes: an inorganic electrochromic material and an organic electrochromic material. Herein, the inorganic electrochromic material includes: tungsten trioxide $WO_3$, and the organic electrochromic material includes polythiophenes and derivatives thereof, viologen, viologen compounds, tetrathiafulvalene, metal phthalocyanine compounds or polyaniline.

In an exemplary embodiment, when the electrochromic material is polyaniline, polyaniline may be formed by an electrochemical process or a chemical oxidation process of aniline. Dipping an electrode into hydrochloric acid solution containing low concentration aniline will produce a polyaniline film on the electrode. According to different oxidation states, polyaniline may be presented as light yellow, dark green or black.

At the display stage, the color change layer may absorb, by maintaining low light transmittance under the role of the first electric field, ambient light transmitted through the display unit and light emitted by the display unit itself. At the fingerprint identification stage, the color change layer may ensure, by maintaining high light transmittance under the role of the second electric field, that light reflected by the fingerprint to be detected can enter the unit for fingerprint identification.

In an exemplary embodiment, first electrodes of adjacent structures for adjusting light transmittance are connected to each other, and second electrodes of adjacent structures for adjusting light transmittance are connected to each other.

Since the first electrodes of the adjacent structures for adjusting light transmittance are connected to each other and the second electrodes of the adjacent structures for adjusting light transmittance are connected to each other, the light transmittance of all structures for adjusting light transmittance is same regardless of which point light source in the display unit emits light.

Figure 7:
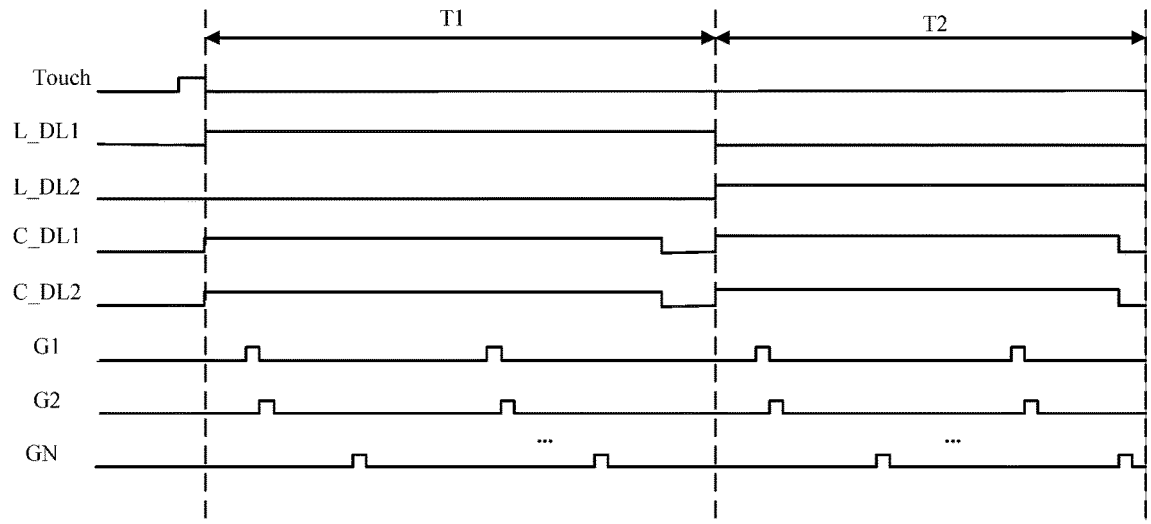
FIG. 7 is an operating timing diagram of a unit for fingerprint identification provided by an exemplary embodiment.

FIG. 7 is an operating timing diagram of a unit for fingerprint identification provided by an exemplary embodiment. The operating timing diagram provided in FIG. 7 is an operating timing diagram corresponding to that the first electrodes of the adjacent structures for adjusting light transmittance are connected to each other and the second electrodes of the adjacent structures for adjusting light transmittance are connected to each other. Illustration is given in FIG. 7 by taking two point light sources as an example. As shown in FIG. 7, Touch is a touch trigger signal, L_DLi is a control signal for triggering the i-th point light source to emit light, C_DLi is a control signal provided by the control unit to the i-th structure for adjusting light transmittance, G1~GN are control signals for triggering identification of the unit for fingerprint identification, wherein i is a positive integer less than or equal to 2, and the unit for fingerprint identification includes N rows and M columns of photoelectric sensors, and Gi is configured to trigger the i-th row of photoelectric sensors to convert optical signals into electrical signals.

As shown in FIG. 7, in a panel for fingerprint identification provided by an exemplary embodiment, when the panel for fingerprint identification detects pressing of a designated region, the panel for fingerprint identification will generate a trigger signal, and perform fingerprint identification after waiting for a next display period. The fingerprint identification stage includes: a first stage T1 and a second stage T2.

At the first stage T1, the control signal L_DL1 by which the panel for fingerprint identification triggers the first point light source to emit light is a valid level, and the first point light source emits light. The control signal C_DL1 provided by the control unit to the first structure for adjusting light transmittance and the control signal C_DL2 provided by the control unit to the second structure for adjusting light transmittance are also valid levels. The light transmittance of the first structure for adjusting light transmittance and the light transmittance of the second structure for adjusting light transmittance are both high light transmittance. Control signals G1 to GN by which the control unit triggers identification of the unit for fingerprint identification are sequentially valid levels, and the unit for fingerprint identification receives light transmitted through the first structure for adjusting light transmittance and the second structure for adjusting light transmittance to generate a first fingerprint image.

At the second stage T2, the control signal L_DL2 by which the panel for fingerprint identification triggers the second point light source to emit light is a valid level, and the second point light source emits light. The control signal C_DL1 provided by the control unit to the first structure for adjusting light transmittance and the control signal C_DL2 provided by the control unit to the second structure for adjusting light transmittance are also valid levels. The light transmittance of the first structure for adjusting light transmittance and the light transmittance of the second structure for adjusting light transmittance are both high light transmittance. Control signals G1 to GN by which the control unit triggers identification of the unit for fingerprint identification are sequentially valid levels, and the unit for fingerprint identification receives light transmitted through the first structure for adjusting light transmittance and the second structure for adjusting light transmittance to generate a second fingerprint image.

The unit for fingerprint identification splices the first fingerprint image and the second fingerprint image to form a fingerprint image to identify a fingerprint.

Since the first electrodes of the adjacent structures for adjusting light transmittance are connected to each other and the second electrodes of the adjacent structures for adjusting light transmittance are connected to each other, control signals provided by the control unit to all structures for adjusting light transmittance are same at the fingerprint identification stage, and light transmittance of different structures for adjusting light transmittance is same.

In an exemplary embodiment, first electrodes of adjacent structures for adjusting light transmittance are spaced apart, and second electrodes of adjacent structures for adjusting light transmittance are spaced apart. As a result, the light transmittance of different structures for adjusting light transmittance at the fingerprint identification stage may be different, the lag phenomenon of a bright spot, which arises from an influence of light emitted by one point light source on part of a fingerprint image formed when a next point light source emits light, may be avoided, and fingerprint identification precision may be improved.

When the first electrodes of the adjacent structures for adjusting light transmittance are spaced apart and the second electrodes of the adjacent structures for adjusting light transmittance are spaced apart, the i-th point light source corresponds to the i-th structure for adjusting light transmittance. Under a state that the i-th point light source emits light, the control unit 40 is configured to, at the fingerprint identification stage, control light transmittance of the i-th structure for adjusting light transmittance to be first light transmittance according to the second control signal, and control light transmittance of all other structures for adjusting light transmittance except the i-th structure for adjusting light transmittance to be second light transmittance, wherein the first light transmittance is less than or greater than the second light transmittance, $1 \leq i \leq N$, and the N is a quantity of point light sources.

Taking the first light transmittance being low light transmittance and the second light transmittance being high light transmittance as an example, when a point light source is lit, under the control of the control unit, the unit for adjusting light transmittance makes the structure for adjusting light transmittance corresponding to the point light source have low light transmittance and another structure for adjusting light transmittance have high light transmittance. When a next point light source is lit, under the control of the control unit, the unit for adjusting light transmittance makes the structure for adjusting light transmittance corresponding to the point light source have low light transmittance and another structure for adjusting light transmittance have high light transmittance. This may effectively avoid technical problems of low accuracy of formed fingerprint images and lower fingerprint identification precision caused by sequentially lit point light sources in a fingerprint identification process.

Figure 8:
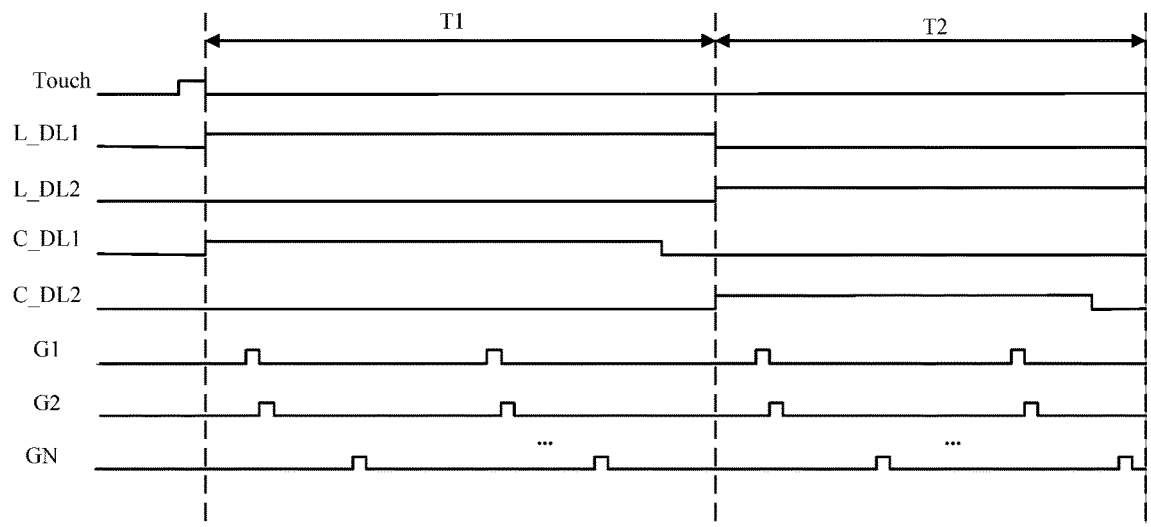
FIG. 8 is an operating timing diagram of a unit for fingerprint identification provided by another exemplary embodiment.

FIG. 8 is an operating timing diagram of a unit for fingerprint identification provided by another exemplary embodiment. The operating timing diagram provided in FIG. 8 is an operating timing diagram corresponding to that the first electrodes of the adjacent structures for adjusting light transmittance are spaced apart and the second electrodes of the adjacent structures for adjusting light transmittance are spaced apart. Illustration is given in FIG. 8 by taking two point light sources as an example. As shown in FIG. 8, Touch is a touch trigger signal, L_DLi is a control signal for triggering the i-th point light source to emit light, C_DLi is a control signal provided by the control unit to the i-th structure for adjusting light transmittance, G1~GN are control signals for triggering identification of the unit for fingerprint identification, wherein i is a positive integer less than or equal to 2, and the unit for fingerprint identification includes N rows and M columns of photoelectric sensors, and Gi is configured to trigger the i-th row of photoelectric sensors to convert optical signals into electrical signals. As shown in FIG. 8, in the panel for fingerprint identification provided by the embodiment of the present disclosure, when pressing of a designated region is detected, the panel for fingerprint identification generates a trigger signal, and then fingerprint identification is performed after waiting for a next display period. The fingerprint identification stage includes: a first stage T1 and a second stage T2.

At the first stage T1, the control signal L_DL1 by which the panel for fingerprint identification triggers the first point light source to emit light is a valid level, and the first point light source emits light. A control signal provided by the control unit to the control signal C_DL1 provided by a first structure for adjusting light transmittance is an invalid level, so that light transmittance of the first structure for adjusting light transmittance is low light transmittance, and the control signal C_DL2 provided by the control unit to a second structure for adjusting light transmittance is a valid level, so that light transmittance of the second structure for adjusting light transmittance is high light transmittance. Control signals G1 to GN by which the control unit triggers identification of the unit for fingerprint identification are sequentially valid levels, and the unit for fingerprint identification receives light transmitted through the first structure for adjusting light transmittance and the second structure for adjusting light transmittance to generate a first fingerprint image.

At the second stage T2, the control signal L_DL2 by which the panel for fingerprint identification triggers the second point light source to emit light is a valid level, and the second point light source emits light. A control signal provided by the control unit to the control signal C_DL1 provided by a first structure for adjusting light transmittance is a valid level, so that light transmittance of the first structure for adjusting light transmittance is high light transmittance, and the control signal C_DL2 provided by the control unit to a second structure for adjusting light transmittance is an invalid level, so that light transmittance of the second structure for adjusting light transmittance is low light transmittance. Control signals G1 to GN by which the control unit triggers identification of the unit for fingerprint identification are sequentially valid levels, and the unit for fingerprint identification receives light transmitted through the first structure for adjusting light transmittance and the second structure for adjusting light transmittance to generate a second fingerprint image.

The unit for fingerprint identification splices the first fingerprint image and the second fingerprint image to form a fingerprint image to identify a fingerprint.

Since the first electrodes of the adjacent structures for adjusting light transmittance are connected to each other and the second electrodes of the adjacent structures for adjusting light transmittance are connected to each other, control signals provided by the control unit to all structures for adjusting light transmittance are not completely same at the fingerprint identification stage, so that the light transmittance of different structures for adjusting light transmittance is not completely same. This may avoid an influence on formed partial fingerprint images due to a previous point light source when a next point light source is lit up and the formed partial fingerprint images are obtained in a fingerprint identification process, and improve accuracy of the formed fingerprint image and fingerprint identification precision.

Figure 9A:
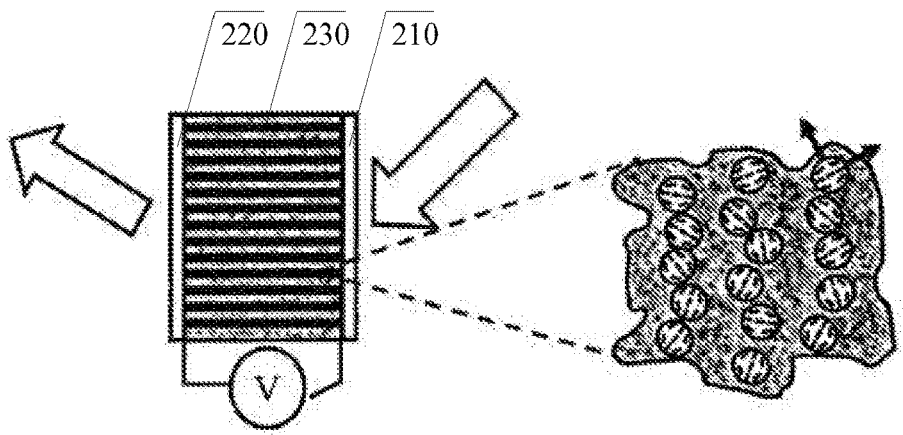
FIG. 9A is a first state diagram of a layer for adjusting light transmittance provided by an exemplary embodiment.
Figure 9B:
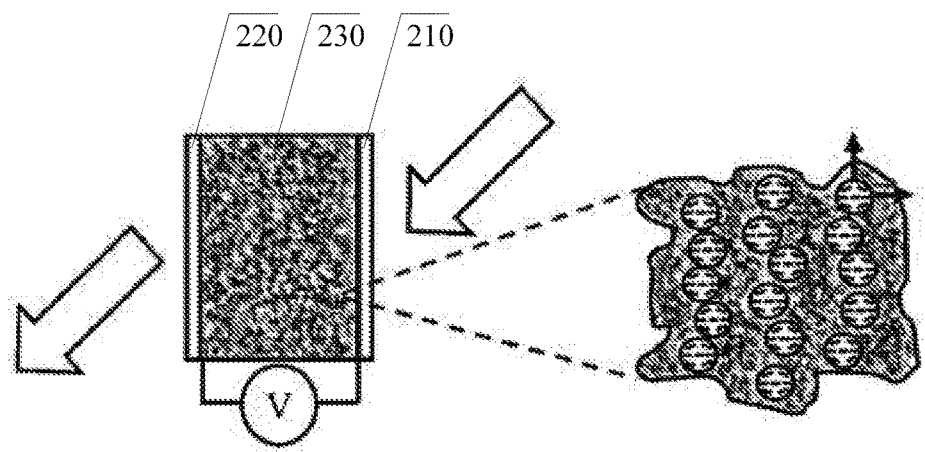
FIG. 9B is a second state diagram of a layer for adjusting light transmittance provided by an exemplary embodiment.

Taking the layer for adjusting light transmittance being a liquid crystal layer and two point light sources as an example, FIG. 9A is a first state diagram of a layer for adjusting light transmittance provided by an exemplary embodiment and FIG. 9B is a second state diagram of a layer for adjusting light transmittance provided by an exemplary embodiment. As shown in FIG. 9A, when the control unit does not provide an electrical signal to the layer for adjusting light transmittance according to the second control signal, liquid crystal molecules in the layer for adjusting light transmittance are in a first state, and the light transmittance of the layer for adjusting light transmittance is low light transmittance. As shown in FIG. 9B, when the control unit provides an electrical signal to the layer for adjusting light transmittance according to the second control signal, liquid crystal molecules in the layer for adjusting light transmittance are in a second state, and the light transmittance of the layer for adjusting light transmittance is high light transmittance.

Figure 10:
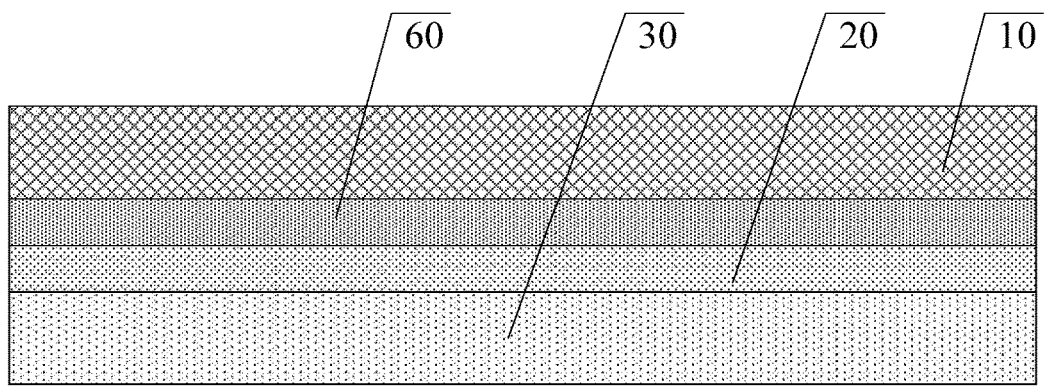
FIG. 10 is a schematic structural diagram of a panel for fingerprint identification provided by yet another exemplary embodiment.

FIG. 10 is a schematic structural diagram of a panel for fingerprint identification provided by yet another exemplary embodiment. As shown in FIG. 10, the panel for fingerprint identification may further include: a collimating layer 60.

The collimating layer 60 is disposed on a side of the unit for adjusting light transmittance 20 close to the display unit 10, and is configured to filter incident light, so that light with a scattering angle within a threshold range is transmitted to the unit for adjusting light transmittance. The incident light is the light transmitted through the display unit at the display stage, and second light reflected by the fingerprint to be detected at the fingerprint identification stage.

In an exemplary embodiment, the collimating layer 60 may include: a lens or an optical fiber.

In an exemplary embodiment, the threshold range may be determined according to a fingerprint identification precision.

The collimating layer may filter the second light reflected by the fingerprint to be detected, so that the light with the scattering angle within the threshold range is emitted toward the unit for adjusting light transmittance. Therefore, any photoelectric sensor can only receive the light reflected from a position opposite to the photoelectric sensor on the fingerprint to be detected, an influence of the light, which is reflected from other positions of the fingerprint to be detected, on the situation when the photoelectric sensor obtains an fingerprint image according to the received light may be avoided, and accuracy of the fingerprint image may be improved in an optical fingerprint identification process.

Figure 11:
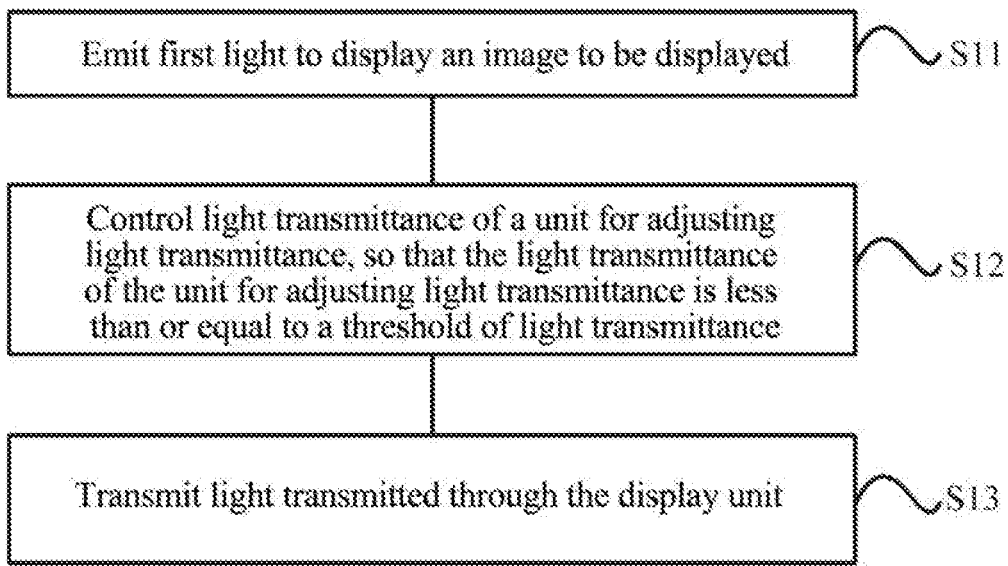
FIG. 11 is a flowchart of a control method of a panel for fingerprint identification at a display stage provided by an embodiment of the present disclosure.

An embodiment of the present disclosure also provides a control method of a panel for fingerprint identification, which is applied to the panel for fingerprint identification. FIG. 11 is a flowchart of a control method of a panel for fingerprint identification at a display stage provided by an embodiment of the present disclosure. As shown in FIG. 11, the control method of the panel for fingerprint identification provided by the embodiment of the present disclosure includes following acts at the display stage:

Act S11: first light is emitted to display an image to be displayed.

Act S12: light transmittance of a unit for adjusting light transmittance is controlled, so that the light transmittance of the unit for adjusting light transmittance is less than or equal to a threshold of light transmittance.

Act S13: light transmitted through the display unit is transmitted.

The panel for fingerprint identification is a panel for fingerprint identification provided by any one of the above embodiments, has similar implementation principle and effect, and is not repeated here.

Figure 12:
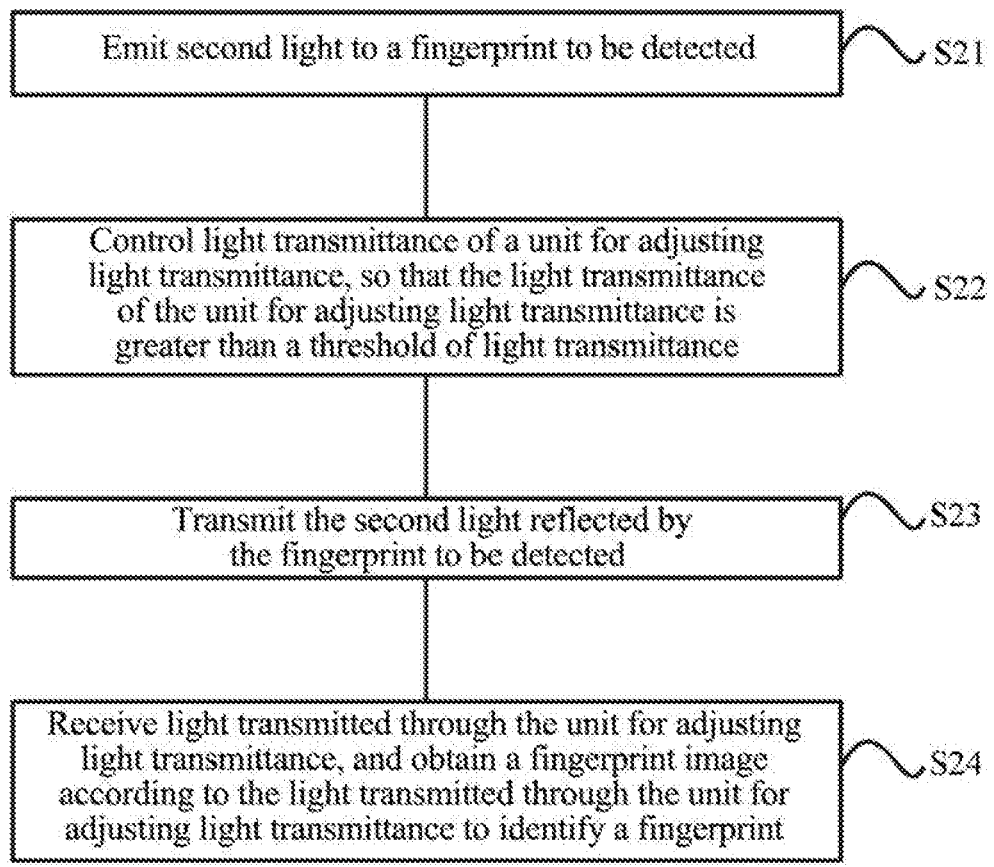
FIG. 12 is a flowchart of a control method of a panel for fingerprint identification at a fingerprint identification stage provided by an exemplary embodiment.

FIG. 12 is a flowchart of a control method of a panel for fingerprint identification at a fingerprint identification stage provided by an exemplary embodiment. As shown in FIG. 12, the control method of the panel for fingerprint identification provided by an exemplary embodiment includes following acts at the fingerprint identification stage:

Act S21: second light is emitted to a fingerprint to be detected.

Act S22: light transmittance of a unit for adjusting light transmittance is controlled, so that the light transmittance of the unit for adjusting light transmittance is greater than a threshold of light transmittance.

Act S23: the second light reflected by the fingerprint to be detected is transmitted.

Act S24: light transmitted through the unit for adjusting light transmittance is received, and a fingerprint image is obtained according to the light transmitted through the unit for adjusting light transmittance to identify a fingerprint.

An embodiment of the present disclosure also provides an apparatus for fingerprint identification, including a panel for fingerprint identification.

The panel for fingerprint identification is a panel for fingerprint identification provided by any one of the above embodiments, has similar implementation principle and effect, and is not repeated here.

The drawings in the present disclosure only refer to the structures involved in the embodiments of the present disclosure, and other structures may refer to common designs.

For the sake of clarity, the thickness and the size of layers or microstructures are exaggerated in the drawings used to describe embodiments of the present disclosure. It will be understood that when an element such as a layer, a film, a region or a substrate is referred to as being "on" or "under" another element, the element may be "directly" located "on" or "under" another element, or intervening elements may exist.

Although embodiments disclosed in the present disclosure are as the above, the said contents are only embodiments used for better understanding the present disclosure, rather than being used to restrict the present disclosure. Any person skilled in the art which the present disclosure belongs to may make any modifications and variations in the form and details of implementation without departing from the spirit and the scope of the present disclosure, but the patent protection scope of the present disclosure shall still be subject to the scope defined in the appended claims.

What is claimed is:

1. A panel for fingerprint identification, comprising: a display unit, a control unit, and a unit for adjusting light transmittance and a unit for fingerprint identification which are disposed on a backlight side of the display unit, the unit for adjusting light transmittance being disposed on a side of the unit for fingerprint identification close to the display unit, and an operating state of the panel for fingerprint identification comprising a display stage and a fingerprint identification stage; wherein,
   at the display stage,
      the display unit is configured to emit first light to display an image to be displayed,
      the unit for adjusting light transmittance is configured to transmit light transmitted through the display unit, and
      the control unit being connected with the unit for adjusting light transmittance is configured to control light transmittance of the unit for adjusting light transmittance so that the light transmittance of the unit for adjusting light transmittance is less than or equal to a threshold of light transmittance;
   wherein at the fingerprint identification stage,
      the display unit is configured to emit second light to a fingerprint to be detected,
      the unit for adjusting light transmittance is configured to transmit the second light reflected by the fingerprint to be detected,
      the control unit is configured to control the light transmittance of the unit for adjusting light transmittance so that the light transmittance of the unit for adjusting light transmittance is greater than the threshold of light transmittance, and
      the unit for fingerprint identification is configured to receive light transmitted through the unit for adjusting light transmittance and obtain a fingerprint image according to the light transmitted through the unit for adjusting light transmittance to identify a fingerprint.

2. The panel for fingerprint identification according to claim 1, wherein the control unit is configured to generate a first control signal at the display stage, and control the light transmittance of the unit for adjusting light transmittance according to the first control signal, so that the light transmittance of the unit for adjusting light transmittance is less than or equal to the threshold of light transmittance.

3. The panel for fingerprint identification according to claim 2, wherein the control unit is configured to generate a second control signal at the fingerprint identification stage, and control the light transmittance of the unit for adjusting light transmittance according to the second control signal, so that the light transmittance of the unit for adjusting light transmittance is greater than the threshold of light transmittance.

4. The panel for fingerprint identification according to claim 3, wherein the unit for fingerprint identification comprises: a substrate and multiple photoelectric sensors disposed on the substrate; and
   the multiple photoelectric sensors are disposed on a side of the substrate close to the display unit.

5. The panel for fingerprint identification according to claim 3, wherein the display unit comprises: multiple point light sources, and the multiple point light sources sequentially emit light at the fingerprint identification stage.

6. The panel for fingerprint identification according to claim 5, wherein the unit for adjusting light transmittance comprises: multiple structures for adjusting light transmittance, wherein the multiple structures for adjusting light transmittance correspond to the multiple point light sources one by one;

an orthographic projection of the structures for adjusting light transmittance on the display unit covers an orthographic projection of the point light sources corresponding to the structures for adjusting light transmittance on the display unit; and the control unit is connected with each structure for adjusting light transmittance, and is configured to control light transmittance of each structure for adjusting light transmittance.

7. The panel for fingerprint identification according to claim 6, wherein each structure for adjusting light transmittance comprises: a first electrode and a second electrode, and a layer for adjusting light transmittance disposed between the first electrode and the second electrode;

the control unit is connected with the first electrode and the second electrode; and the control unit is configured to:

at the display stage, provide electric signals to the first electrode and the second electrode according to a first control signal and form a first electric field between the first electrode and the second electrode so that light transmittance of the layer for adjusting light transmittance is less than or equal to the threshold of light transmittance under a role of the first electric field; and at the fingerprint identification stage, provide electrical signals to the first electrode and the second electrode according to a second control signal, and form a second electric field between the first electrode and the second electrode so that the light transmittance of the layer for adjusting light transmittance is greater than the threshold of light transmittance under a role of the second electric field.

8. The panel for fingerprint identification according to claim 7, wherein the first electrode and the second electrode are transmissive electrodes.

9. The panel for fingerprint identification according to claim 8, wherein first electrodes of adjacent structures for adjusting light transmittance are spaced apart, and second electrodes of adjacent structures for adjusting light transmittance are spaced apart.

10. The panel for fingerprint identification according to claim 9, wherein an i-th point light source corresponds to an i-th structure for adjusting light transmittance; and under a state that the i-th point light source emits light, the control unit is configured to, at the fingerprint identification stage, control light transmittance of the i-th structure for adjusting light transmittance to be first light transmittance according to the second control signal, and control light transmittance of all other structures for adjusting light transmittance except the i-th structure for adjusting light transmittance to be second light transmittance, wherein the first light transmittance is less than or greater than the second light transmittance, $1 \le i \le N$, and the N is a quantity of point light sources.

11. The panel for fingerprint identification according to claim 8, wherein first electrodes of adjacent structures for adjusting light transmittance are connected to each other, and second electrodes of adjacent structures for adjusting light transmittance are connected to each other.

12. The panel for fingerprint identification according to claim 7, wherein the layer for adjusting light transmittance is a liquid crystal layer; and the liquid crystal layer comprises: a holographic polymer dispersed liquid crystal Bragg grating or a cholesteric liquid crystal.

13. The panel for fingerprint identification according to claim 7, wherein the layer for adjusting light transmittance is a color change layer; and a preparation material of the color change layer comprises: polyaniline, viologen, tungsten trioxide, polythiophenes and derivatives thereof, viologen compounds, tetrathiafulvalene or metal phthalocyanine compounds.

14. The panel for fingerprint identification according to claim 1, wherein the panel for fingerprint identification further comprises: a collimating layer;

the collimating layer is disposed on a side of the unit for adjusting light transmittance close to the display unit, and is configured to filter incident light, so that light with a scattering angle within a threshold range is emitted toward the unit for adjusting light transmittance; and the incident light is the light transmitted through the display unit at the display stage, and the second light reflected by the fingerprint to be detected at the fingerprint identification stage.

15. The panel for fingerprint identification according to claim 1, wherein the unit for fingerprint identification is disposed on a side of the unit for adjusting light transmittance remote from the display unit by an optical adhesive.

16. The panel for fingerprint identification according to claim 15, wherein the display unit comprises: an organic light emitting diode display substrate.

17. An apparatus for fingerprint identification, comprising: the panel for fingerprint identification according to claim 1.

* * * * *